United States Patent
Shibuya (10) Patent No.: US 7,265,569 B2
(45) Date of Patent: Sep. 4, 2007

(54) TEST APPARATUS

(76) Inventor: Atsunori Shibuya, 192-102, Oaza Mitsugi, Kohnosu-shi, Saitama (JP) 365-0066

( * ) Notice: Subject to any disclaimer, the term of this patent is extended or adjusted under 35 U.S.C. 154(b) by 24 days.

(21) Appl. No.: 11/119,344

(22) Filed: Apr. 29, 2005

(65) Prior Publication Data
US 2006/0125499 A1    Jun. 15, 2006

Related U.S. Application Data

(63) Continuation of application No. PCT/JP2004/018664, filed on Dec. 14, 2004.

(51) Int. Cl.
G01R 31/26    (2006.01)
G01R 31/28    (2006.01)

(52) U.S. Cl. .................. 324/765; 324/158.1
(58) Field of Classification Search ................ 324/754, 324/158.1
See application file for complete search history.

(56) References Cited

U.S. PATENT DOCUMENTS 4,397,021 A * 8/1983 Lloyd et al. ................... 714/33
5,386,189 A * 1/1995 Nishimura et al. ...... 324/158.1
5,426,361 A * 6/1995 Simmons ................. 324/158.1
5,640,102 A   6/1997 Sato

FOREIGN PATENT DOCUMENTS

| JP | 8-179011 | 7/1996 |
| JP | 9-166637 | 6/1997 |
| JP | 2004-177160 | 6/2004 |

OTHER PUBLICATIONS

International Search Report issued in International application No. PCT/JP2004/018664 mailed on May 4, 2005, 2 pages.

* cited by examiner

Primary Examiner—Ha Tran Nguyen
Assistant Examiner—Robert Velez
(74) Attorney, Agent, or Firm—Osha Liang LLP (57) ABSTRACT

A test apparatus for testing electronic devices, comprising a control section for generating control signals based on a test program set in advance to test the electronic devices, a plurality of test modules for generating test signals to be supplied to the electronic devices on the basis of the control signals, a device interface having connectors, provided in correspondence to the plurality of test modules, for supplying the test signals generated by corresponding test modules to predetermined pins of the electronic devices, wherein a test module for generating source power to be supplied to the electronic device outputs the source power only when it is connected with a connector set in advance among the plurality of connectors and does not output source power when it is not connected with the connector set in advance.

5 Claims, 11 Drawing Sheets

| Slot | Board Name | Existence | Vendor ID | Module ID | Physical | Product No | Product S/N | Smx Port | PB1 | PB2 | Bus Port |
|---|---|---|---|---|---|---|---|---|---|---|---|
| 1 | SyncGen | 1 | AT | 5 | 2 | 000 | 000 | 3 | 62 | | 2 |
| 2 | | | | | | | | | | | |
| 3 | DM250M | 1 | AT | 4 | 4 | 000 | 000 | 1 | 80 | | 6 |
| 4 | DM250M | 1 | AT | 4 | 1 | 000 | 000 | 13 | 22 | | 3 |
| 5 | | | | | | | | | | | |
| 6 | LCDPS | 1 | AT | 6 | 2 | | 000 | | 71 | 70 | 18 |
| 7 | | | | | | | | | | | |
| 8 | | | | | | | | | | | |
| ..... | | | | | | | | | | | |
| 64 | SyncGen | 1 | AT | 5 | 1 | 000 | 000 | 1 | 1 | | 1 |

TEST APPARATUS

The present application is a continuation application of PCT/JP2004/018664 filed on Dec. 14, 2004, the contents of which are incorporated herein by reference.

BACKGROUND OF THE INVENTION

1. Field of the Invention

The present invention relates to a test apparatus for testing electronic devices and more specifically to a test apparatus that supplies signals generated by a plurality of test modules to the electronic devices.

2. Description of Related Art

Conventionally, as a configuration of a test apparatus for testing electronic devices such as semiconductor circuits, there has been known one comprising a device interface for mounting electronic devices, a plurality of test modules, connected with the electronic devices through an intermediary of the device interface, for generating input signals to be input to the electronic devices and a control section for supplying signals for controlling the test modules. The test modules are installed in slots provided between the device interface and the control section.

The plurality of test modules are provided per each function, e.g., a module for generating electricity of power source (referred to simply as source power hereinafter) to be supplied to the electronic devices, a module for generating pattern signals to be supplied to the electronic devices, and so on.

The device interface is provided with a plurality of connectors in correspondence to the plurality of test modules. Each connector connects the corresponding test module with a predetermined input pin of the electronic device.

In such a conventional test apparatus, each test module must be connected with the predetermined connector, respectively. When the test module for generating the source power is connected with a different connector in particular, there is a possibility that a large power is supplied to a pattern-input pin of the electronic device.

Although a test apparatus, in which disposition of the test modules is fixed, does not causes such problem, a test apparatus wherein disposition of the test modules may be changed has come to be developed lately. Accordingly, there is a possibility of erroneously disposing the test modules in the test apparatus having such a configuration, connecting the power module to the pattern input pin of the electronic device for example.

SUMMARY OF INVENTION

It is therefore an object of the present invention to provide a test apparatus that can solve the above-mentioned problem. This object may be achieved by combining features described in an independent claim of the present invention. Dependent claims specify further preferable embodiments thereof.

According to a first aspect of the present invention, there is provided a test apparatus for testing electronic devices, including a control section for generating control signals based on a test program set in advance to test the electronic devices, a plurality of test modules for generating test signals to be supplied to the electronic devices on the basis of the control signals and a device interface having connectors, provided in correspondence to the plurality of test modules, for supplying the test signals generated by the corresponding test modules to predetermined pins of the electronic devices, wherein the test module for generating source power to be supplied to the electronic devices outputs the source power only when it is connected with the connector set in advance among the plurality of connectors and does not output source power when it is not connected with the connector set in advance.

Preferably, each connector has two detecting pins provided at predetermined positions, the two detecting pins of the connector set in advance to be connected with the test module for generating the source power are short-circuited, the two detecting pins of the connectors other than that set in advance are not short-circuited, and the test module for generating the source power detects whether or not the two detecting pins of the connected connector are short-circuited and is allowed to supply the source power to the electronic device when the two detecting pins are short-circuited.

Preferably, the test module for generating the source power includes a switch for switching whether or not the generated source power is to be output to the outside and a switch control section connected with the two detecting pins of the corresponding connector to detect whether or not the two detecting pins are short-circuited and to control the switch based on the detected result.

The device interface may further include a diagnostic decoder for sequentially supplying diagnostic signals received from a diagnostic test module to the respective test modules via the respective connectors and the control section may detect the test module to which the diagnostic signal is supplied via each connector to detect the connector with which the test module is connected based on the detected result and is allowed to supply the source power from the test module to the electronic device when the test module for generating the source power is connected with the connector set in advance.

Preferably, the device interface further includes a switching circuit for selectively switching the connection of each test module with the connector.

Accordingly, the present invention allows the electronic devices to be prevented from being damaged even when the test modules are erroneously connected.

It is noted that the summary of the present invention does not necessarily describe all necessary features of the present invention. The present invention may also be a sub-combination of the features described above.

DETAILED DESCRIPTION OF THE PRESENT INVENTION

The present invention will now be described based on preferred embodiments, which do not intend to limit the scope of the present invention, but exemplify the present invention. All of the features and the combinations thereof described in the embodiments are not necessarily essential to the present invention.

Figure 1:
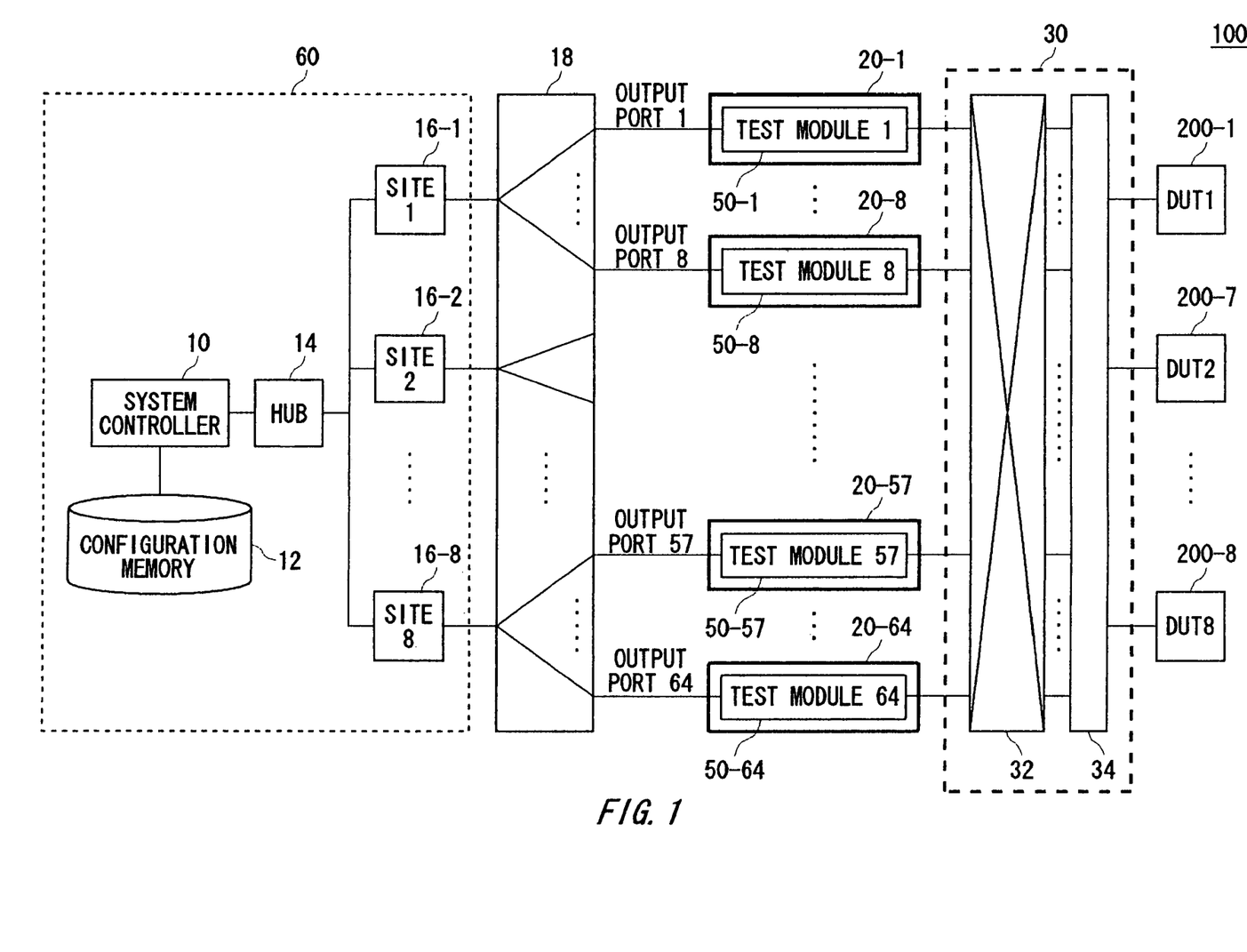
FIG. 1 is a diagram showing one exemplary configuration of a test apparatus according to an embodiment of the present invention.

FIG. 1 is a diagram showing one exemplary configuration of a test apparatus 100 of the present invention. The test apparatus 100 is an apparatus for testing a plurality of electronic devices 200-1 through 200-8 (generically denoted as 200 hereinafter) such as semiconductor chips and includes a control section 60, a bus switching section 18, a plurality of slots 20-1 through 20-64 (generically denoted as 20 hereinafter), a plurality of test modules 50-1 through 50-64 (generically denoted as 50 hereinafter) and a device interface 30.

The control section 60 inputs a plurality of control signals to the bus switching section 18 in accordance to a test program set in advance to test the electronic devices 200. The control section 60 has a system controller 10, a configuration memory 12, a hub 14 and a plurality of sites 16-1 through 16-8 (generically denoted as 16 hereinafter).

The system controller 10 controls operations of the test apparatus 100 in accordance to the test program. That is, it generates the control signals in accordance to the test program. The plurality of sites 16 are provided in correspondence to the plurality of electronic devices 200 to be tested and control the test modules 50 connected with the corresponding electronic devices 200 to transmit/receive signals to/from the test modules 50. The hub 14 distributes the control signals generated by the system controller 10 to the respective sites 16. The configuration memory 12 stores a configuration file specifying settings of the test apparatus 100 in advance. Here, the configuration file may be a file stored by a user of the test apparatus 100 in advance. The settings of the test apparatus 100 include settings of the bus switching section 18, information on the test module 50 to be used, settings of the device interface 30, information specifying a connector of the device interface 30 with which an output port of the bus switching section 18 is connected, module identification information for identifying the test modules 50 to be installed in the respective slots 20 and so on.

The bus switching section 18 has a plurality of output ports and switches the output ports from which an input signal is output. That is, the bus switching section 18 sets the output ports allocated to the respective sites 16. For example, the bus switching section 18 of the present embodiment allocates eight ports to the respective sites 16, i.e., the output ports 1 through 18 to the site 16-1, the output ports 9 through 16 to the site 16-2 and so forth. The control section 60 controls the bus switching section 18 to control the output port from which each control signal is to be output.

The plurality of slots 20 are slots wherein the test modules 50 are installed and are provided in correspondence to the plurality of output ports of the bus switching section 18. Each test module 50 transmits/receives signals to/from the corresponding electronic device 200 and is provided per each function for testing the electronic device 200. For instance, the test module 50 may be what generates an input signal to be input to the corresponding electronic device 200 based on the control signal, receives an output signal output from the corresponding electronic device 200 and judges whether or not the electronic device 200 is non-defective. The test module 50 may also be what supplies source power to the electronic device 200. Still more, the test module 50 may be what transmits/receives analog or digital signals to/from the electronic device 200 or what transmits/receives DC or AD signals to/from the electronic device 200.

The device interface 30 is a board on which the electronic devices 200 are mounted to electrically connect the electronic devices 200 with the test modules 50. The device interface 30 includes a performance board 34 on which a plurality of connectors to be connected with the plurality of electronic devices 200 are provided and a switching circuit 32 for selectively switching the connectors with which the plurality of slots 20 are connected. The performance board 34 is called as a load board in some cases.

Thereby, the test apparatus 100 of the present embodiment allows the input ports of the bus switching section 18 to be arbitrarily connected with the output ports and the slots 20 by switching the bus switching section 18. Still more, the output ports of the bus switching section 18 and the slots 20 may be arbitrarily connected with the connectors of the device interface 30 by switching the switching circuit 32. The switching circuit 32 has a plurality of cables for example, so that the connection of the slots 20 with the connectors may be changed by changing the wiring of the cables. It is noted that the switching circuit 32 is called as a test fixture in some cases.

Figure 2:
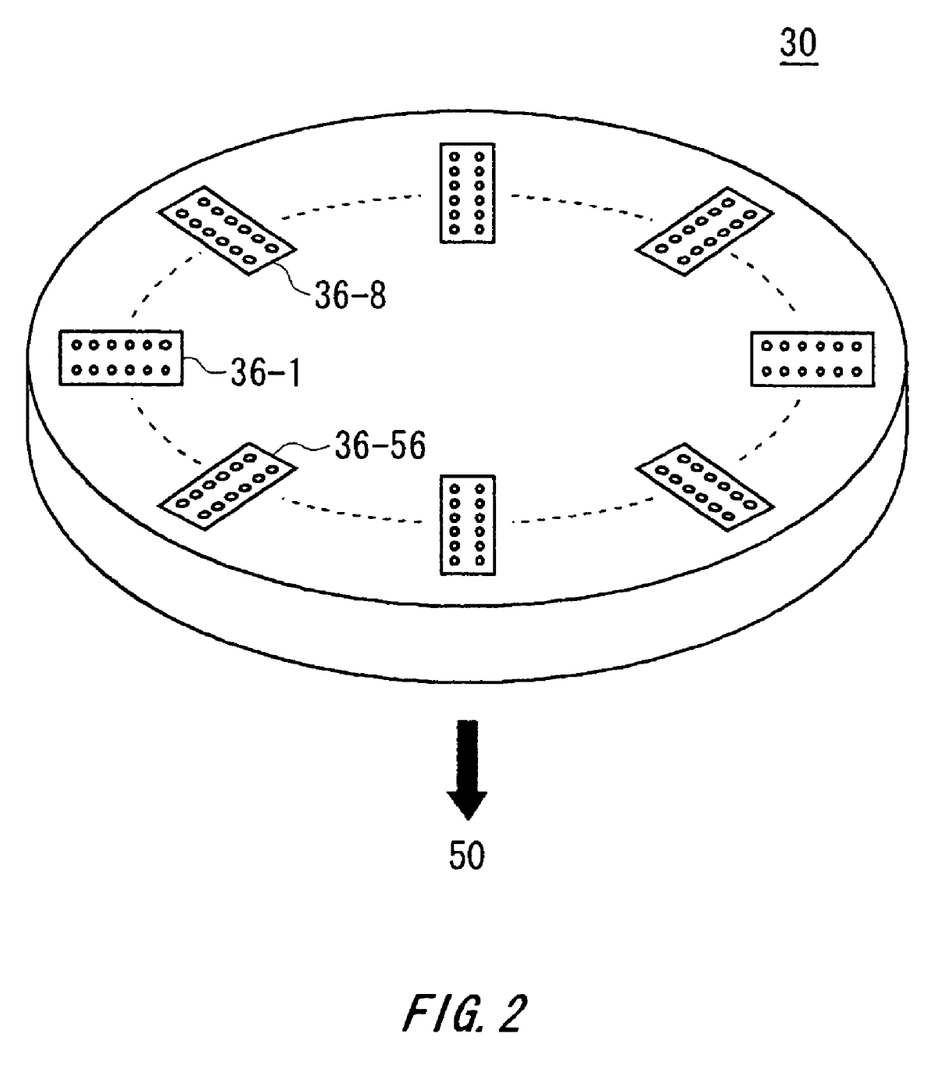
FIG. 2 is one exemplary conceptual drawing of a device interface.

FIG. 2 is one exemplary conceptual drawing of the device interface 30. As shown in FIG. 2, the device interface 30 has the plurality of connectors 36-1 through 36-64 (generically denoted as 36 hereinafter) provided in correspondence to the plurality of test modules 50.

Each connector 36 is connected with the corresponding test module 50 and with predetermined pins of the electronic device 200. For example, the connector 36 connected with a power source pin of the electronic device 200 is connected with the test module 50 for generating source power among the plurality of test modules 50 and supplies source power to the electronic device 200.

The test module 50 for generating the source power to be supplied to the electronic device 200 supplies the source power to the electronic device 200 when it is connected with the predetermined connector 36 among the plurality of connectors 36 and does not supply power to the electronic device 200 when it is not connected with the connector 36 set in advance. Here, the connector 36 set in advance is what is connected with the power source pin of the electronic device 200.

It is possible to arrange so that the test module 50 or the control section 60 detects whether or not the test module 50 for generating the source power is connected with the connector 36 set in advance. The case of detecting that by the test module 50 will be explained at first.

Figure 3:
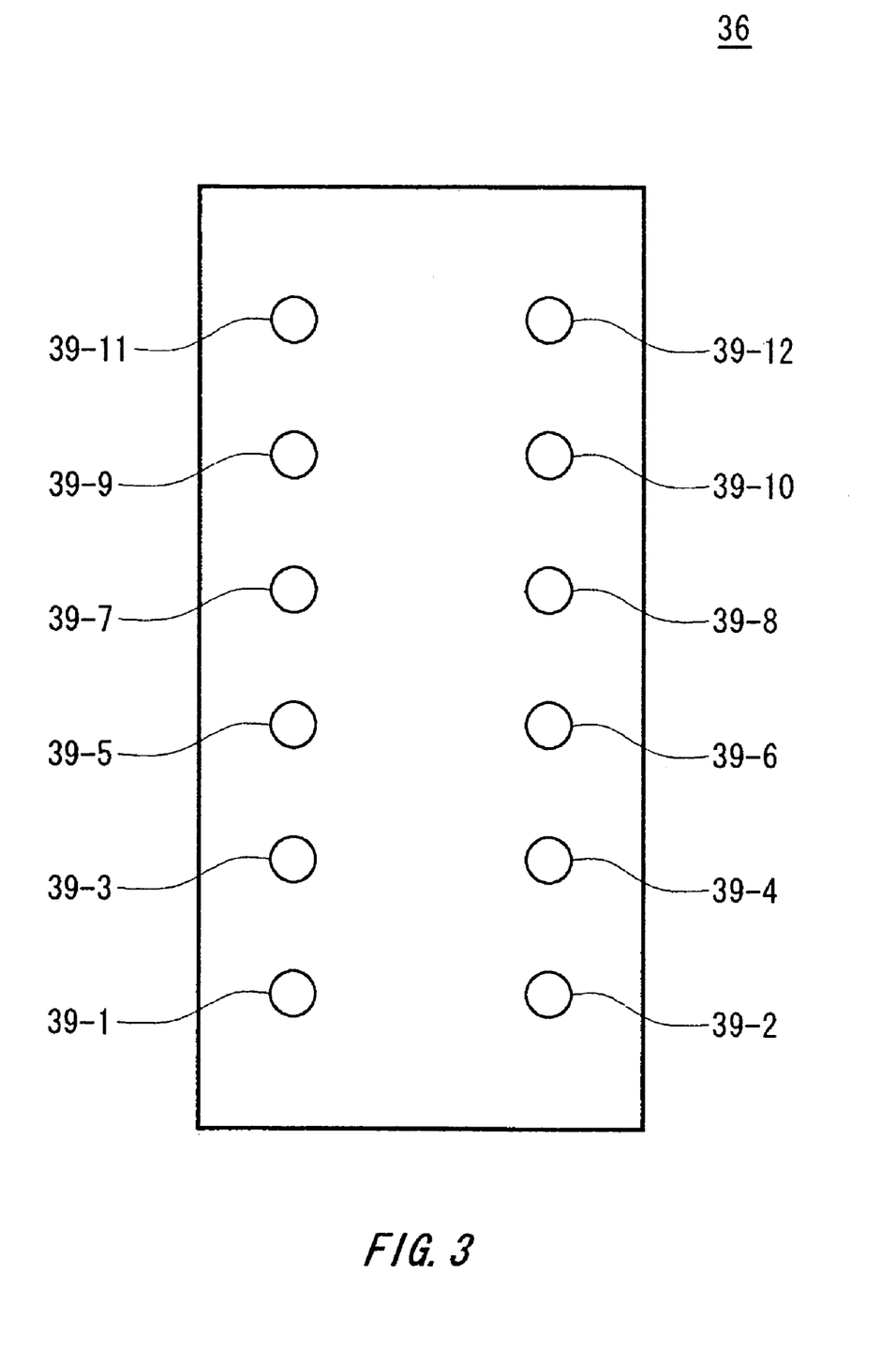
FIG. 3 shows one exemplary configuration of each connector.

FIG. 3 shows one exemplary configuration of each connector 36. Each connector 36 has a plurality of pins 39-1 through 39-12 (generically denoted as 39 hereinafter). Each connector 36 has also two detecting pins provided at predetermined position. The pins 39-1 and 39-2 function as the detecting pins in the present embodiment.

Here, the predetermined pins 39-1 and 39-2 of the connector 36, which are to be connected with the test module 50 for generating source power, are short-circuited, and the pins 39-1 and 39-2 of the connector 36, which are not connected with the test module 50 for generating source power, are not short-circuited.

The test module 50 for generating source power detects whether or not the pins 39-1 and 39-2 of the connector 36 connected with are short-circuited and supplies the source power to the electronic device 200 when those pins are short-circuited. The test module 50 does not supply source power to the electronic device when those pins are not short-circuited.

Figure 4:
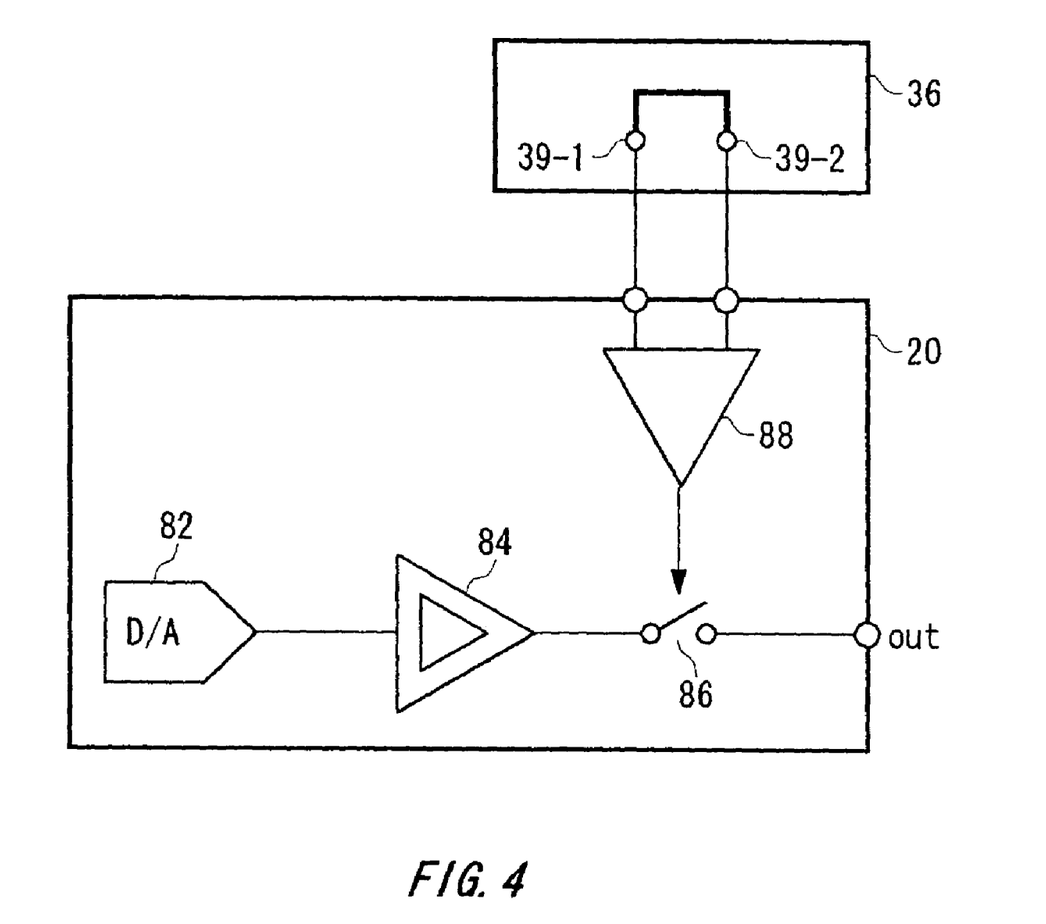
FIG. 4 is a diagram showing a part of configuration of a test module for generating source power and a part of the connector.

FIG. 4 is a diagram showing a part of configuration of the test module 50 for generating source power and a part of the connector 36. The test module 50 has a digital-analog converter 82, a power amplifying circuit 84, a switch 86 and a switch control section 88.

The digital-analog converter 82 generates a voltage corresponding to a voltage value set in advance. The power amplifying circuit 84 generates the source power to be supplied to the electronic device 200 based on the voltage generated by the digital-analog converter 82. The switch 86 switches whether or not the source power generated by the power amplifying circuit 84 is to be output to the outside.

The switch control section 88 is connected with the two detecting pins 39-1 and 39-2 of the corresponding connector 36 to detect whether or not the pins are short-circuited and to control the switch 86 based on the detected result. That is, the switch control section 88 turns on the switch 86 when the pins are short-circuited to cause the source power to be supplied to the electronic device 200 and turns off the switch 86 when the pins are not short-circuited so as not to supply source power to the electronic device 200.

Although the test module 50 for generating source power has the switch control section 88 in the present embodiment, the switch control section 88 may be provided in the device interface 30 in another embodiment. In this case, the test module 50 for generating source power is provided with an input terminal for receiving signals output from the switch control section 88 and the switch 86 operates in accordance to the signals received through the input terminal.

According to the test apparatus 100 of the present embodiment, the test module 50 for generating source power outputs the source power only when it is connected with the predetermined connector 36, so that it becomes possible to prevent the electronic device 200 from being damaged even when the test module 50 is erroneously connected.

Next, the case of detecting the connection of the test module 50 with the connector 36 by the control section 60 will be explained.

Figure 5:
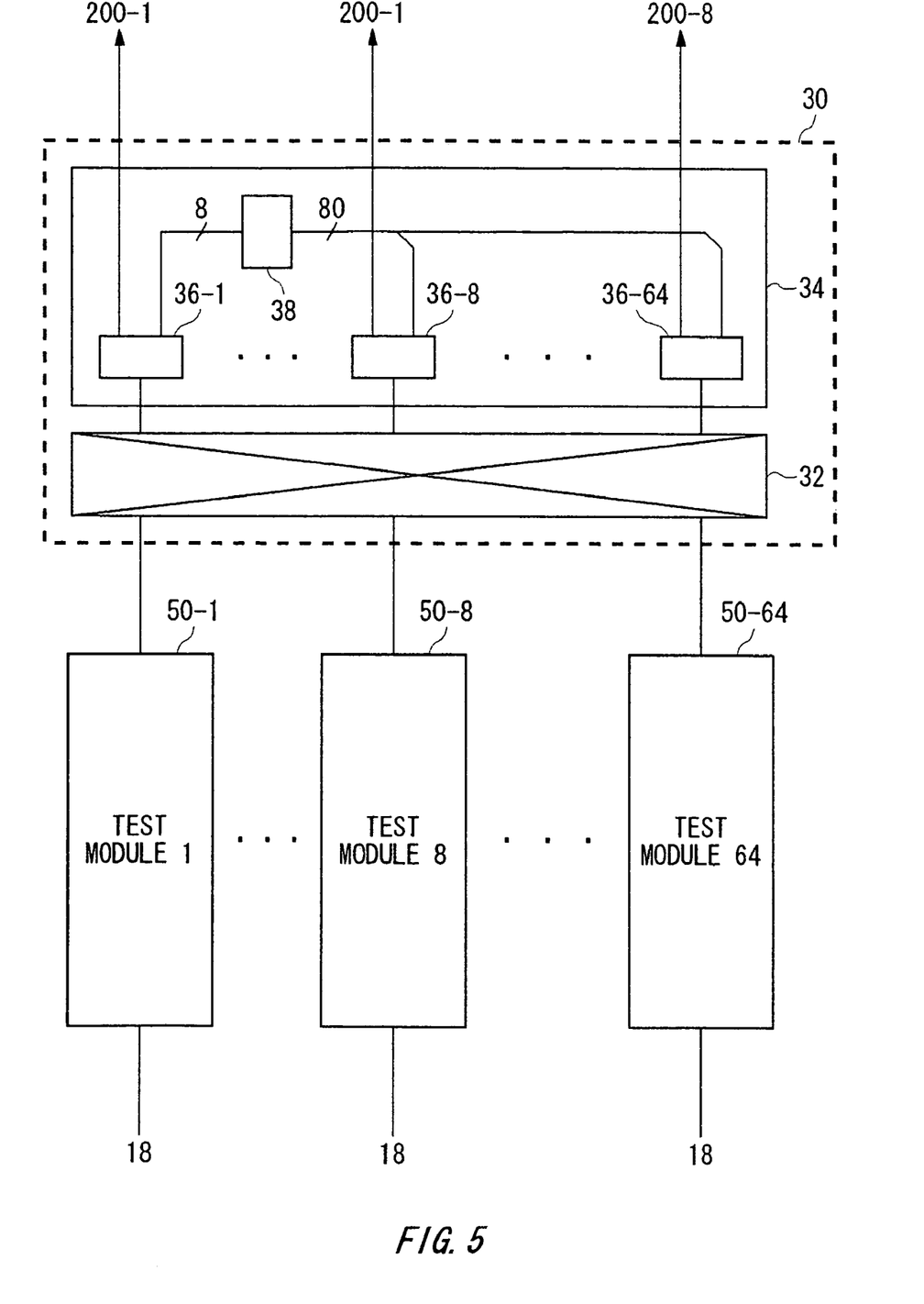
FIG. 5 is a diagram showing one exemplary configuration of a performance board.

FIG. 5 is a diagram showing one exemplary configuration of the performance board 34. The performance board 34 has the plurality of connectors 36-1 through 36-64 (generically denoted as 36 hereinafter) and a diagnostic decoder 38.

The plurality of connectors 36 are connected with the test modules 50 via the switching circuit 32 to electrically connect the test modules 50 with the electronic devices 200. The test modules 50 may be connected arbitrarily with the connectors 36 as described above by setting the switching circuit 32.

The test apparatus 100 of the present embodiment has a test mode for testing the electronic devices 200 and a diagnostic mode for confirming the connection of the output ports of the bus switching section 18 with the connectors 36.

In operating in the test mode, each test module 50 transmits/receives signals to/from the electronic device 200 via the corresponding connector 36. In operating in the diagnostic mode, the test apparatus 100 is provided with a diagnostic test module 50 in the predetermined slot 20. The diagnostic module 50 transmits a diagnostic signal from each connector 36 in order of the switching circuit 32, the other test module 50 and the output port of the bus switching section 18. The control section 60 detects the other test module 50 to which the diagnostic signal which has been supplied to each connector 36 is transmitted to confirm if the setting of the switching circuit 32 matches with the configuration file stored in the configuration memory 12. That is, the control section 60 judges whether or not the plurality of output ports, the plurality of test modules 50 and the plurality of connectors 36 are correctly connected by comparing the detected result of the connection of the respective output ports with the connectors 36 with the configuration file.

When the test module 50 for generating source power is connected with the connector 36 set in advance, the control section 60 causes the test module 50 to supply the source power to the electronic device 200. When the test module 50 is not connected with the connector 36 set in advance, the control section 60 causes the test module 50 not to output source power. For instance, the control section 60 may generate the control signal to be sent to the test module 50 based on the result of detection of the connection.

When the plurality of output ports, the plurality of test modules 50 and the plurality of connectors 36 are not correctly connected, the control section 60 may also be arranged so as to inform of that to the user of the test apparatus 100.

Next, a concrete operation in judging the connection will be explained. The diagnostic decoder 38 supplies the diagnostic signal received from the slot 20 in which the diagnostic test module 50 is installed sequentially to the respective test modules 50 via the respective connectors 36. The slot 20 in which the diagnostic test module 50 is installed is set in advance. The diagnostic test module 50 is installed in the slot 20-1 in this example.

That is, the diagnostic decoder 38 supplies the diagnostic signal received from the slot 20-1 via the connector 36-1 set in advance among the plurality of connectors 36 sequentially to the respective test modules 50. When the test apparatus 100 operates in the diagnostic mode here, the control section 60 controls the switching circuit 32 so that the slot 20-1 in which the diagnostic test module 50-1 is installed is connected with the connector 36-1 set in advance among the plurality of connectors 36 and supplies the control signal to the diagnostic test module 50-1 so that it generates the diagnostic signal.

In correspondence to the received control signal, the test module 50-1 generates the diagnostic signal specifying each connector 36. For instance, the diagnostic test module 50-1 generates the diagnostic signal of a plurality of bits specifying each connector 36 by a binary number. A diagnostic decoder 80 decodes the diagnostic signal of the binary number to a diagnostic signal of a plurality of bits wherein only bit expressed by the binary number is 1. Each bit of the diagnostic signal output from the diagnostic decoder 80 corresponds to any one of the plurality of connectors 36 and each bit of the diagnostic signal is supplied to the test module 50 via the corresponding connector 36. For instance, the diagnostic test module 50-1 can supply the diagnostic signal indicating a predetermined logical value sequentially to each test module 50 by sequentially generating the diagnostic signals of the binary number that increases by 1 each. This will be explained below by using a diagnostic signal of logic H for example.

Figure 6:
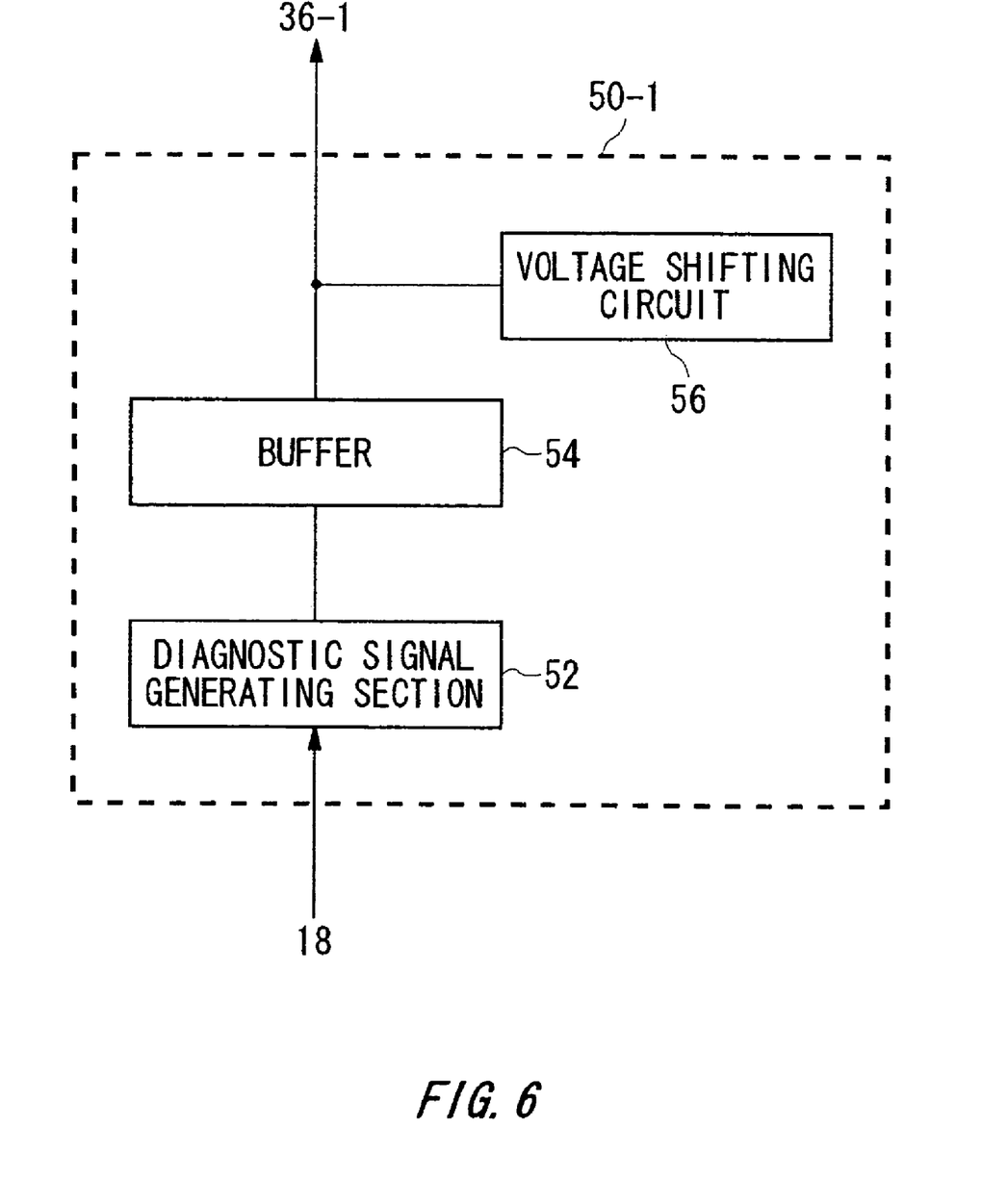
FIG. 6 is a diagram showing one exemplary configuration of a diagnostic test module.

FIG. 6 is a diagram showing one exemplary configuration of the diagnostic test module 50-1. The diagnostic test module 50-1 has a diagnostic signal generating section 52, a buffer 54 and a voltage shifting circuit 56.

The diagnostic signal generating section 52 generates the diagnostic signal corresponding to the control signal supplied from the control section 60 via the bus switching section 18 as described above. For instance, the control section 60 supplies the plurality of control signals for sequentially specifying the respective connectors 36 to the diagnostic signal generating section 52 and the diagnostic signal generating section 52 sequentially generates the diagnostic signal of the binary number corresponding to the connectors 36 specified by the respective control signals. The buffer 54 is provided between the diagnostic signal generating section 552 and the voltage shifting circuit 56 to supply the diagnostic signal generated by the diagnostic signal generating section 52 to the diagnostic decoder 38 via the connector 36-1. The voltage shifting circuit 56 regulates the voltage level of the diagnostic signal output from the buffer 54 to an arbitrary level.

Figure 7:
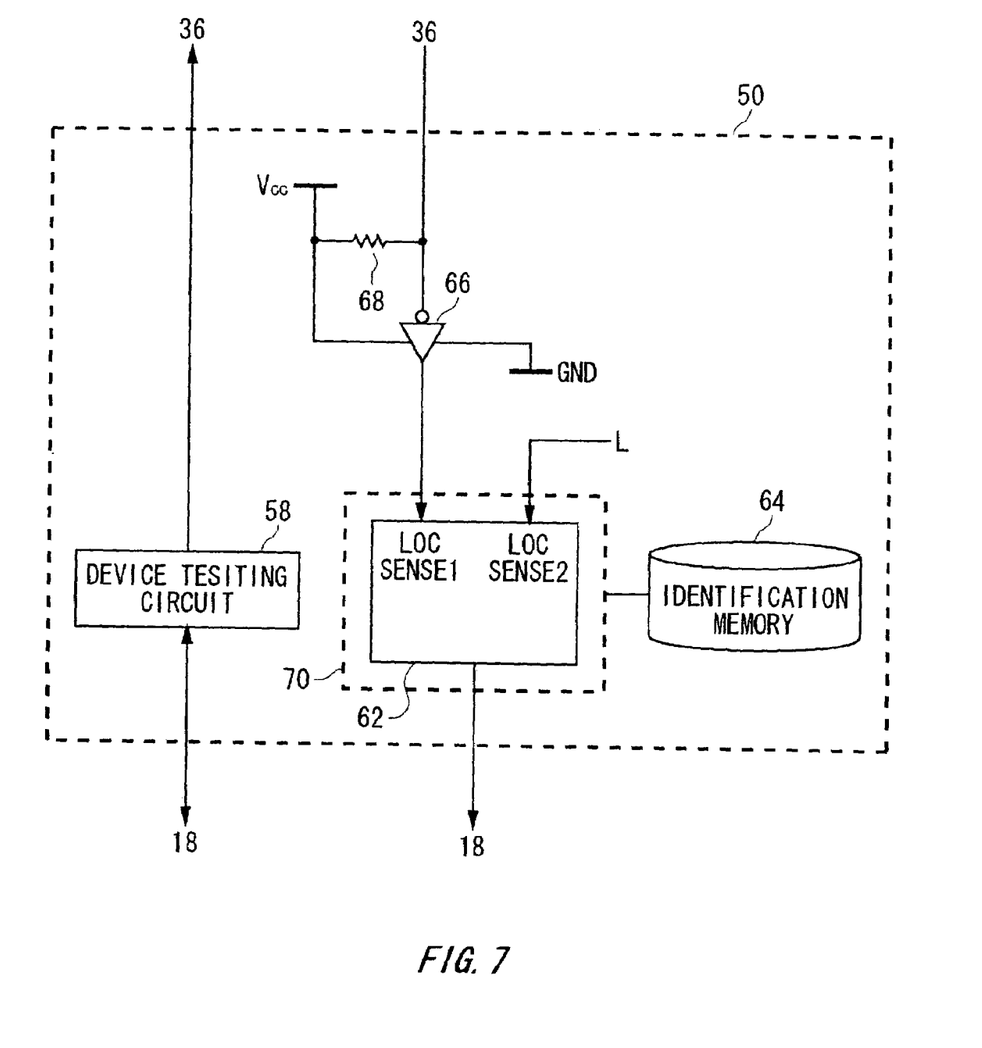
FIG. 7 is a diagram showing one exemplary configuration of another test module.

FIG. 7 is a diagram showing one exemplary configuration of another test module 50. Here, the other test module 50 means what is installed in the slot 20 other than that wherein the diagnostic test module 50-1 is installed.

The test module 50 has a device testing circuit 58 for testing the electronic device 200 and a diagnostic circuit 70 for outputting a predetermined signal to the control section 60 when it receives the diagnostic signal indicating the logic H.

The device testing circuit 58 is controlled by the control signal supplied from the control section 60 when the test apparatus 100 operates in the test mode. The device testing circuit 58 also informs of the test result of the electronic device 200 to the control section 60 via the bus switching section 18.

On receiving the diagnostic signal indicating the logic H, the diagnostic circuit 70 outputs a predetermined signal to the control section 60. In the present embodiment, the diagnostic circuit 70 outputs the predetermined signal to the control section 60 via the output and input ports of the bus switching section 18 corresponding to the slot 20 in which the test module 50 is installed. Here, the predetermined signal may be the diagnostic signal. The diagnostic circuit 70 may output the signal to the control section 60 together with information on the test module 50.

The control section 60 is capable of detecting the output port of the bus switching section 18 that is connected with the connector 36 specified by the control signal by receiving the signal output from the diagnostic circuit 70 via the output port of the bus switching section 18. The control section 60 is also capable of judging if the connection of the input and output ports of the bus switching section 18, the slot 20 and the connector 36 matches with the configuration file by detecting the input port of the bus switching section 18 from which it received the signal output from the diagnostic circuit 70.

The diagnostic circuit 70 has a pull-up resistor 68, a buffer 66, a location sense circuit 62 and an identification memory 64. The buffer 66 inputs the diagnostic signal to the location sense circuit 62. The location sense circuit 62 has an input terminal (Loc_SENSE1) to which the diagnostic signal is input and outputs a predetermined signal to the control section 60 when the logic H is input to the input terminal.

The identification memory 64 stores information on module identification, manufacturer identification, production die number, production number and others of the test module 50. On receiving the diagnostic signal of logic H, the diagnostic circuit 70 outputs it to the control section 60 together with such information of the test modules 50. At this time, the control section 60 is capable of judging whether or not the correct test module 50 is installed in each slot 20 by comparing the module identification information received from the test module 50 installed in each slot 20 with the module identification information of the test module 50 to be installed in the slot 20 in the configuration file.

When the test module 50 is connected with the plurality of connectors 36, the location sense circuit 62 has a plurality of input terminals to be connected with the plurality of connectors 36. In this case, preferably the location sense circuit 62 outputs predetermined signals per signal input to the respective input terminals. For instance, when the location sense circuit 62 has two input terminals (Loc_SENSE1, LOC_SENSE2), preferably the location sense circuit 62 sends information indicating whether or not the logical value of the signal input to the input terminal (Loc_SENSE1) is H and information indicating whether or not the logical value of the signal input to the input terminal (LOC_SENSE2) is H to the control section 60. Still more, when the location sense circuit 62 has a plurality of input terminals and is connected with one connector 36, a signal of logic L is input to the input terminal other than that of the location sense circuit 62 that is connected with the connector 36.

Figure 8:
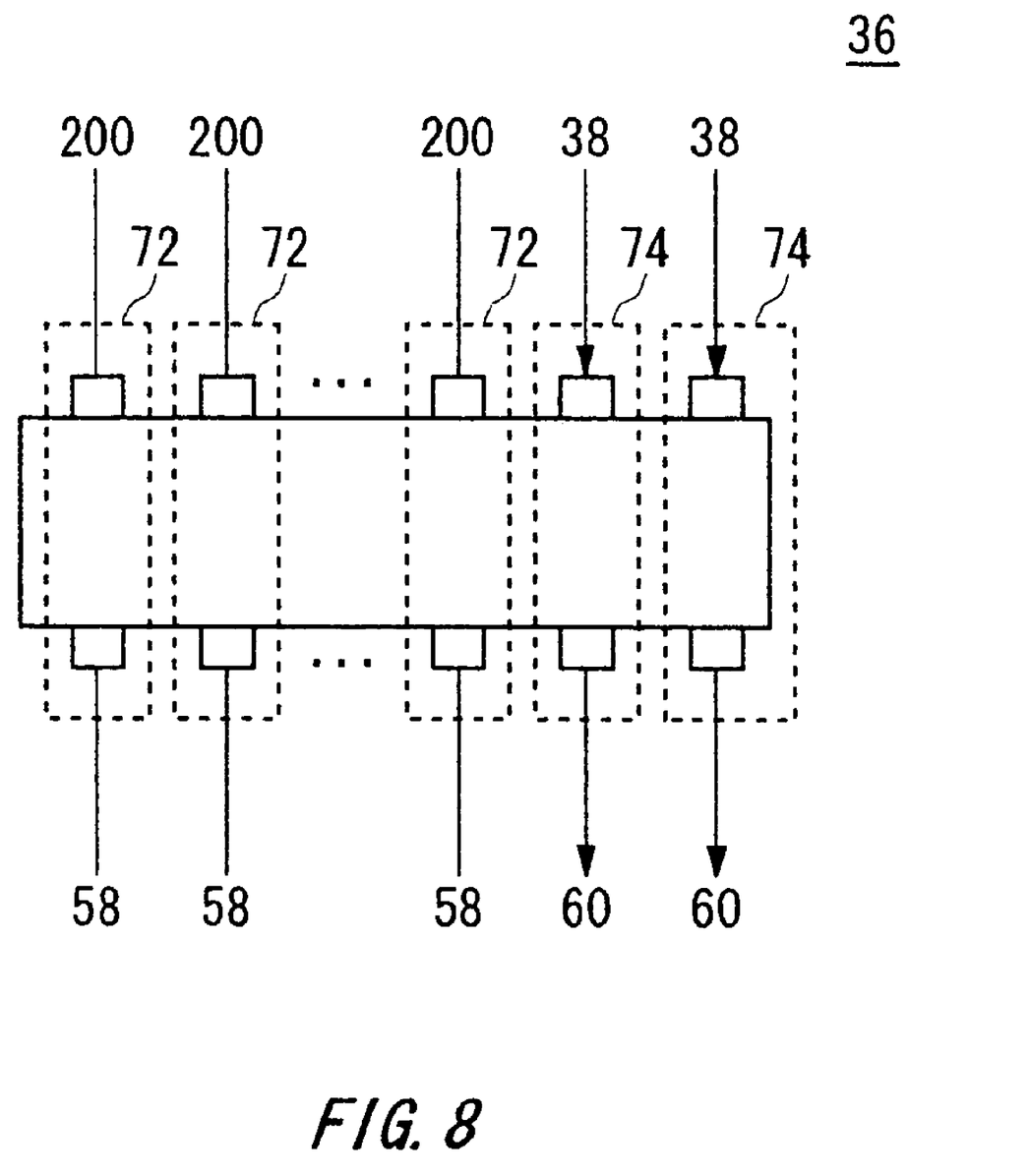
FIG. 8 is a diagram showing one exemplary configuration of the connector.

FIG. 8 is a diagram showing one exemplary configuration of the connector 36. The connector 36 has device pins 72 for connecting the device testing circuits 58 with the electronic devices 200 and diagnostic pins 74 for connecting the diagnostic circuits 70 with the diagnostic decoders 38. Such configuration allows the setting of the test apparatus 100 to be confirmed whether or not it is correctly set after setting the test apparatus 100 to test the electronic devices 200 without altering the setting. Preferably, the device pins 72 and diagnostic pins 74 are provided in the respective connectors 36 in accordance to a pin arrangement set in advance. The connector 36 with which the diagnostic test module 50-1 is connected connects the diagnostic decoder 38 with the diagnostic test module 50-1 through the diagnostic pin 74.

Figure 9:
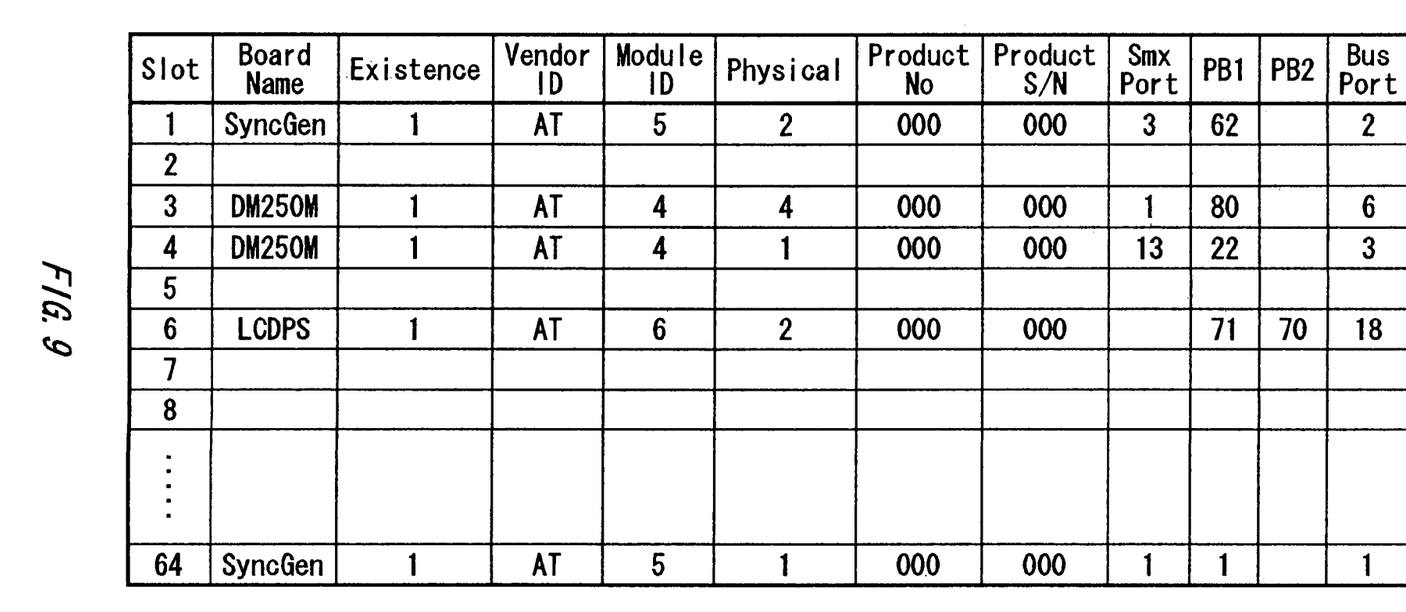
FIG. 9 is a table showing one exemplary data structure of a configuration file.

FIG. 9 is a table showing one exemplary data structure of the configuration file. As shown in the table in FIG. 9, the configuration file memory 12 stores, in advance, the configuration file correlating identification number (Slot) of the slot 20, the name (Board Name) of the test module to be installed in each slot 20, existence information (Existence) indicating whether the test module 50 is installed in each slot 20, information (Vendor ID) identifying the vendor of the test module 50, information (Module ID) identifying the test module 50, physical number (Physical) indicating physical position where the test module 50 is to be installed, product die number (Product ID) of the test module 50, product number (Product S/N) of the test module 50, input port number of the bus switching section 18 to be connected with the test module 50, identification numbers (PB1, PB2) of the connector 36 to be connected with the test module 50 and output port number (Bus Port) of the bus switching section 18 to be connected with the test module 50.

Figure 10:
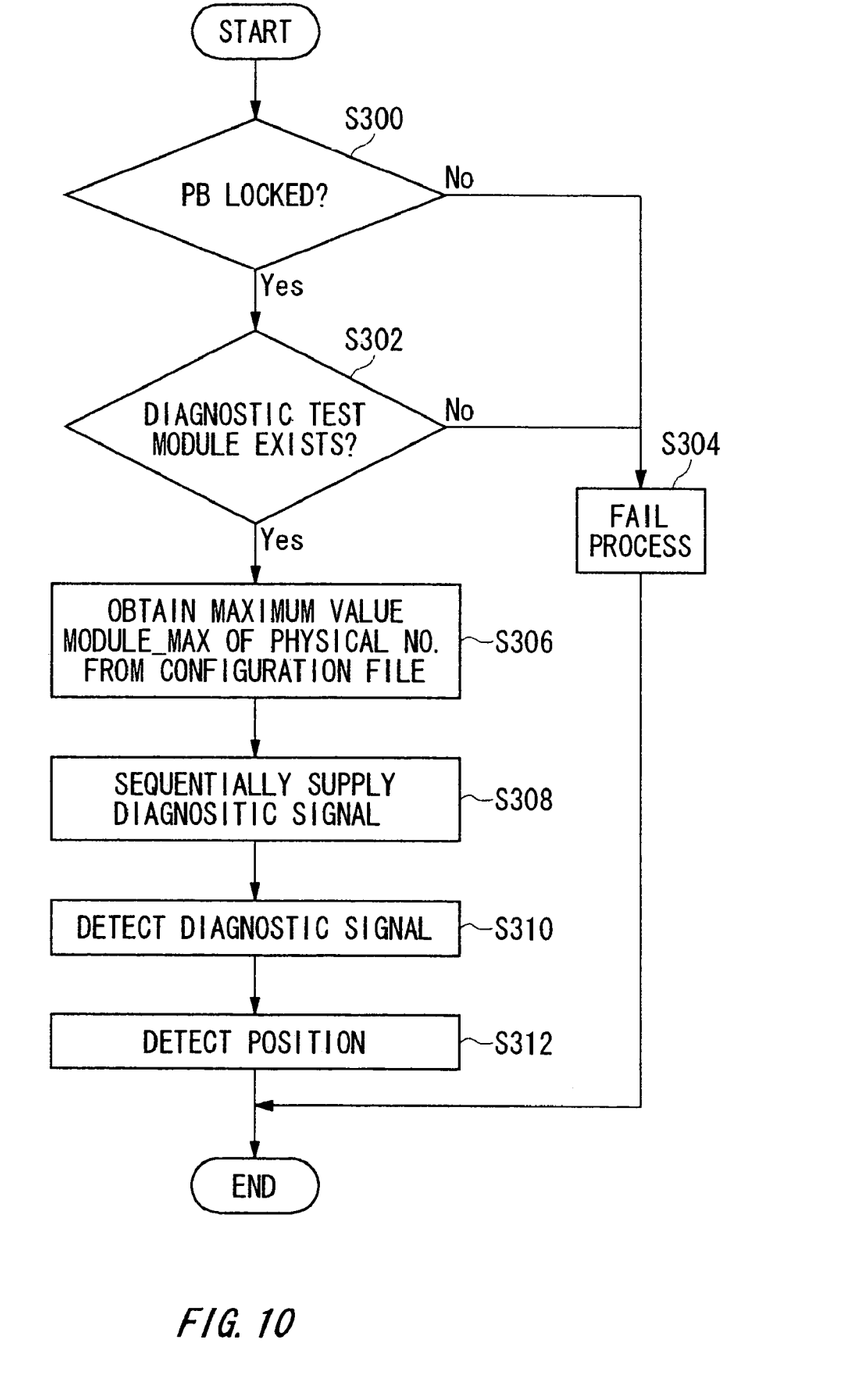
FIG. 10 is a flowchart showing one exemplary configuration method of the test apparatus.

FIG. 10 is a flowchart showing one exemplary configuration method of the test apparatus 100. At first, the setting of the switching circuit 32 is carried out and is locked to test the electronic devices 200. Next, the control section 60 judges whether or not the setting is locked in Step S300. When the setting is not locked, the control section 60 carries out a fail process in Step S304 to end the configuration. When the setting is locked, the control section 60 judges whether or not the diagnostic test module 50-1 is installed in the predetermined slot 20 in Step S302.

When the diagnostic test module 50-1 isnot installed in the predetermined slot 20, the control section 60 carries out the fail process in Step S304 to end the configuration. When the diagnostic test module 50-1 is installed in the predetermined slot 20, the control section 60 obtains a maximum value (Module_max) of the physical numbers set in the configuration file in Step S306.

Next, the control section 60 changes the physical number from 1 to Module_max and sequentially supplies the diagnostic signal of logic H to the connectors 36 corresponding to the respective physical numbers to sequentially supply the diagnostic signal to the respective test modules 50 in a diagnostic signal supplying Step S308.

Next, the control section 60 detects the test module 50 to which the diagnostic signal has been supplied via each connector 36 in a signal detecting Step S310. Then, based on the detected result in the signal detecting Step S310, the control section 60 detects the connector 36 with which each output port is connected in a position detecting Step S312. The processes in Steps S310 and S312 may be repeatedly carried out every time when the diagnostic signal is supplied to any one of the connectors 36 in Step S308.

Figure 11:
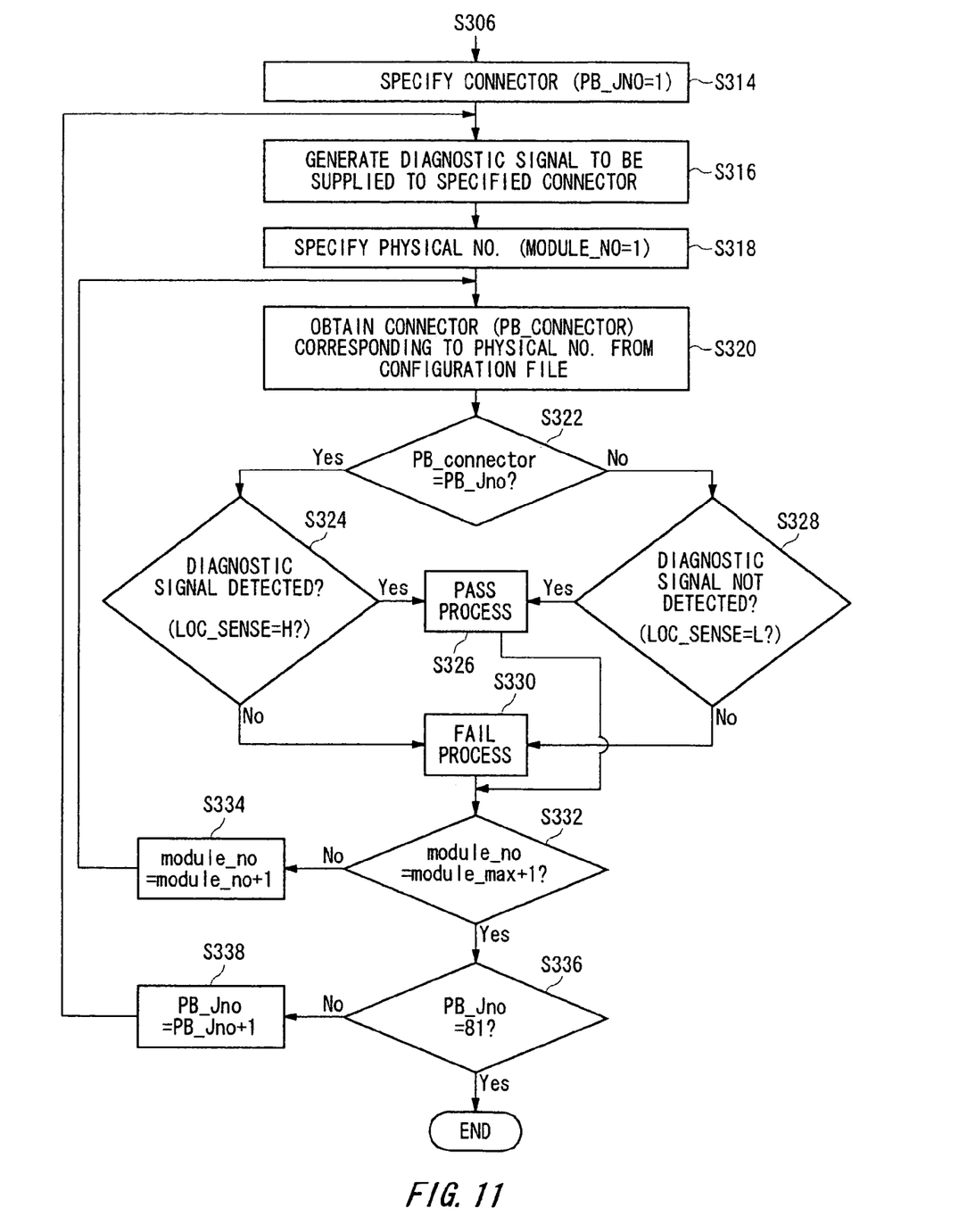
FIG. 11 is a flowchart detailing the processes of Steps S308, S310 and S312 in FIG. 10.

FIG. 11 is a flowchart detailing the processes of Steps S308, S310 and S312 in FIG. 10. At first, the control section 60 specifies the connector 36 whose connection is be diagnosed in Step S314. Here, the connector of identification number 1 (PB_Jno=1) is specified.

Then, the control section 60 causes the diagnostic test module 50-1 to generate the diagnostic signal to be supplied to the specified connector 36 in Step S316. When the connector of identification number 1 is specified, the test module 50-1 generates the diagnostic signal expressing 1 by binary number for example.

Next, the control section 60 specifies the physical number in Step S318. Here, the physical number 1 (module_no=1) is specified. Then, the control section 60 obtains the identification number of the connector 36 (PB_connector=PB_1) corresponding to the physical number from the configuration file in Step S320. When the test module 50 is connected with the plurality of connectors 36 here, the control section 60 obtains a plurality of connector identification numbers, e.g., PB_connector=PB_1 and PB_2, for the physical numbers in Step S320.

Next, the control section 60 compares the connector identification number (PB_Jno) specified in Step S314 with the connector identification number (PB_connector) obtained in Step S320 in Step S322. When PB_connector=PB_Jno, the control section 60 detects whether or not the diagnostic signal of logic H is supplied to the diagnostic circuit 70 of the test module 50 corresponding to the physical number in Step S324. The control section 60 can detect whether or not the diagnostic signal of logic H has been supplied to the diagnostic circuit 70 of the test module 50 based on a signal output from the diagnostic circuit 70 to the output port of the bus switching section 18 corresponding to the physical number for example. That is, the control section 60 detects whether or not the diagnostic signal of the logic H has been input to the input terminal (Loc_SENSE) of the diagnostic circuit 70 based on the signal output to the output port.

When PB_connector=PB _Jno, the diagnostic signal of logic H is supplied to the test module 50 corresponding to the physical number, provided that the setting of the switching circuit 32 has been correctly done. Accordingly, when the control section 60 detects that the diagnostic signal of logic H has been supplied to the diagnostic circuit 70, it carries out a Pass process in Step S326. When it is not detected, the control section 60 carries out the Fail process in Step S330.

When PB_connector≠PB_Jno in Step S322, the control section 60 detects whether or not no diagnostic signal of logic H has been supplied to the diagnostic circuit 70 of the test module 50 corresponding to the physical number in Step S324. When PB_connector≠PB_Jno, a signal of logic L is supplied to the test module 50 corresponding to the physical number, provided that the setting of the switching circuit 32 has been correctly done. Accordingly, when the control section 60 detects that the diagnostic signal of logic H has been supplied to the diagnostic circuit 70, it carries out the Fail process in Step S330. When the control section 60 detects that the signal of logic L has been supplied, it carries out the Pass process in Step S326.

Then, the control section 60 judges whether or not all physical numbers have been scanned in Step S332 by judging whether or not the specified physical number is equal to what 1 is added to the maximum value of the obtained physical number in Step S306. When physical number that has not been scanned exists, the control section 60 adds 1 to the specified physical number in Step S334 and repeats the processes of Steps S320 through S332. When all the physical numbers have been scanned, the control section 60 judges whether or not all the connectors 36 have been diagnosed in Step S336 by judging whether or not the specified connector ID number has increased more than the known connector number. When there exists a non-diagnosed connector 36, the control section 60 adds 1 to the specified connector ID number in Step S338 and repeats the processes of Steps S316 through S336. When the diagnosis of all the connectors 36 ends, the configuration process is finished.

Such process enables to diagnose whether all the connectors 36 are connected with the correct output ports and slots 20 or not.

As it is apparent from the above description, the present invention allows the electronic devices 200 to be prevented from being damaged even when the test modules 50 are erroneously connected.

Although the present invention has been described by way of an exemplary embodiments, it should be understood that those skilled in the art might make many changes and substitutions without departing from the spirit and the scope of the present invention. It is obvious from the definition of the appended claims that the embodiments with such modifications also belong to the scope of the present invention.

What is claimed is:

1. A test apparatus for testing electronic devices, comprising:
   a control section for generating control signals based on a test program set in advance to test said electronic devices;
   a plurality of test modules comprising a test module for generating test signals to be supplied to said electronic devices on the basis of the control signals and a test module for generating source power to be supplied to said electronic devices; and
   a device interface having connectors, provided in correspondence to the plurality of test modules, for supplying the test signals or source power generated by said corresponding test modules to predetermined pins of said electronic devices;
   wherein said test module for generating source power to be supplied to said electronic devices outputs the source power only when it is connected with the connector set in advance among the plurality of connectors and does not output source power when it is not connected with said connector set in advance; and wherein each connector has two detecting pins provided at predetermined positions, the two detecting pins of said connector set in advance to be connected with said test module for generating the source power are short-circuited, the two detecting pins of the connectors other than said connector set in advance are not short-circuited, and said test module for generating the source power detects whether or not the two detecting pins of said connected connector are short-circuited and is allowed to supply the source power to said electronic device when the two detecting pins are short-circuited.

2. The test apparatus as claimed in claim 1, wherein said test module for generating the source power comprises a switch for switching whether or not the generated source power is output to the outside, and a switch control section connected with the two detecting pins of said corresponding connector to detect whether or not the two detecting pins are short-circuited and to control said switch based on the detected result.

3. The test apparatus as claimed in claim 1, wherein said device interface further comprises a diagnostic decoder for sequentially supplying a diagnostic signal received from said diagnostic test module to said respective test modules via said respective connectors; and said control section detects the test module to which said diagnostic signal is supplied via said respective connectors to detect said connector with which said test module is connected based on the detected result and is allowed to supply the source power from said test module to said electronic device when said test module for generating the source power is connected with said connector set in advance.

4. The test apparatus as claimed in claim 3, wherein said device interface further comprises a switching circuit for selectively switching the connection of each test module with said connector.

5. The test apparatus as claimed in claim 1, wherein said device interface further comprises a switching circuit for selectively switching the connection of each test module with said connector.

* * * * *